(12) United States Patent
Koch et al.

(10) Patent No.: US 9,762,073 B2
(45) Date of Patent: Sep. 12, 2017

(54) CHARGING DEVICE FOR A BATTERY PACK

(71) Applicant: Andreas Stihl AG & Co. KG, Waiblingen (DE)

(72) Inventors: Friedhelm Koch, Allmersbach im Tal (DE); Gernot Liebhard, Waiblingen (DE); Thomas Heinrich, Leutenbach (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 97 days.

(21) Appl. No.: 14/841,316

(22) Filed: Aug. 31, 2015

(65) Prior Publication Data

US 2017/0063116 A1     Mar. 2, 2017

(30) Foreign Application Priority Data

Aug. 29, 2014   (DE) .................. 10 2014 012 869

(51) Int. Cl.
*H02J 7/00*         (2006.01)

(52) U.S. Cl.
CPC .......... *H02J 7/0045* (2013.01); *H02J 7/0029* (2013.01)

(58) Field of Classification Search
CPC .............................. H02J 7/0045; H02J 7/0029
USPC ......................................................... 320/112
See application file for complete search history.

(56) References Cited

U.S. PATENT DOCUMENTS

| | | | | |
|---|---|---|---|---|
| 6,342,773 | B2 * | 1/2002 | Sakaue et al. ...... | H01M 2/1055 320/107 |
| 6,455,186 | B1 * | 9/2002 | Moores, Jr. et al. ... | B25F 5/008 320/113 |
| 7,211,347 | B2 * | 5/2007 | Sugiura et al. ..... | H01M 2/1022 429/100 |
| 2007/0219670 | A1 | 9/2007 | Tanaka et al. | |
| 2015/0084591 | A1 | 3/2015 | Kishima et al. | |

FOREIGN PATENT DOCUMENTS

| | | |
|---|---|---|
| CN | 201084796 Y | 7/2008 |
| JP | 2000-48864 A | 2/2000 |

\* cited by examiner

*Primary Examiner* — Sun Lin
(74) *Attorney, Agent, or Firm* — Walter Ottesen, P.A.

(57) ABSTRACT

A charging device for a battery pack has a housing defining a charging receptacle for accommodating the battery pack. Power electronics are arranged in the housing. A cooling air fan is provided in the housing which draws a suction air flow into the housing via a first air inlet opening and blows the suction air flow out of the housing, as a first cooling air flow via an air outlet opening. A battery air flow flows through the battery pack and enters as a first cooling air flow via the first air inlet opening. A further suction air flow is drawn into the housing from surroundings of the housing via a second air inlet opening formed in the housing. The further suction air flow is formed as a second cooling air flow separate from the battery air flow. The power electronics are situated in a flow path between the second air inlet opening and the cooling air fan. The second cooling air flow, after cooling the power electronics, is supplied to the cooling air fan.

10 Claims, 4 Drawing Sheets

CHARGING DEVICE FOR A BATTERY PACK

CROSS REFERENCE TO RELATED APPLICATION

This application claims priority of German patent application no. 10 2014 012 869.5, filed Aug. 29, 2014, the entire content of which is incorporated herein by reference.

BACKGROUND OF THE INVENTION

A charging device for a battery pack includes a preferably closed housing and has an external charging receptacle for a battery pack. In the charging receptacle—normally in the region of a face wall—there are provided electrical connection contacts for the electrical contacting of a battery pack to be inserted. The charging device is formed with an electrical connector for a supply voltage, wherein, between the electrical connector and the connection contacts to the battery pack, there are arranged parallel electronics by way of which the battery pack is electrically charged.

For the dissipation of the heat generated during the charging process, a cooling air fan is arranged in the housing of the charging device, to which cooling air fan a cooling air stream flows, as a suction air stream, via an air inlet opening, the cooling air stream exiting the housing via an air exit opening. Via the air inlet opening, a battery air stream which flows through the battery pack is supplied as a cooling air stream, the cooling air stream also being utilized for cooling the components of the power electronics.

The waste heat generated during the charging of the individual cells in the battery pack leads to an increase in temperature of the cooling air stream, such that the cooling air stream can absorb and discharge only a small amount of heat as it flows around the power electronics. The temperature difference, required for cooling the power electronics, between the cooling air stream and the electronic components of the power electronics is thus dependent on the temperature increase to which the battery air stream is subjected as it flows through the battery pack. In the case of rapid-charging devices or battery packs of large capacity, the cooling of the power electronics may become inadequate.

SUMMARY OF THE INVENTION

It is an object to further develop a charging device for a battery pack such that, firstly, a battery air stream which adequately cools the battery pack is ensured, and secondly, adequate cooling of the power electronics is ensured.

The object is achieved by a charging device for a battery pack. The charging device includes: a housing having a charging receptacle formed thereon; the charging receptacle having outer connecting contacts configured to form an electrical connection with the battery pack; the housing further having an electrical connector configured to connect to a supply voltage; power electronics arranged between the electrical connector and the connecting contacts; the housing defining a first air inlet opening and an air outlet opening; a cooling air fan arranged in the housing and configured to generate a cooling air flow entering the housing as a first suction air flow via the first air inlet opening and exiting the housing via the air outlet opening; the first air inlet opening communicating with a battery air flow flowing through the battery pack so as to permit the battery air flow to flow to the first air inlet opening as a cooling air flow; the housing defining a second air inlet opening configured to permit a further suction air flow to flow into the housing from the ambient of the housing as a second cooling air flow; the second cooling air flow being separate from the battery air flow; the second air inlet opening and the cooling air fan conjointly defining a flow path therebetween; the power electronics being disposed in the flow path; and, the second cooling air flow being guided along the flow path to the cooling air fan after cooling the power electronics.

A further cooling air stream enters the housing from the surroundings of the housing via an air inlet opening formed in the housing, wherein the further cooling air stream is in the form of a suction air stream which is separate from the battery air stream. The power electronics is situated in the flow path between the further air inlet opening and the cooling air fan, wherein the further cooling air stream, after cooling the power electronics, is supplied to the cooling air fan.

The further cooling air stream that enters the interior of the housing is separate from the battery air stream and is therefore not laden with the waste heat of the battery pack, such that an adequately large temperature difference exists between the further cooling air stream and the power components of the power electronics, which ensures intensive, effective cooling of the power electronics. The battery air stream is conveyed through the battery pack separately from the cooling of the power electronics, wherein the cooling air impeller conveys both the battery air stream and the further cooling air stream.

It is advantageously the case that both cooling air streams, that is, the cooling air stream which forms the battery air stream and the further cooling air stream, are in the form of spatially mutually separate suction air streams which are supplied to a common cooling air fan. In this case, the cooling air streams are merged by way of the cooling air fan to form a common exit air stream, that is, are blown out of the housing as a common exit air stream.

The further cooling air stream enters the suction zone of the cooling air fan via a window-like flow opening or recess formed within the housing, wherein the internal flow opening opens directly into the suction zone of the cooling air fan.

The flow opening is provided in the housing downstream of the power electronics as viewed in the flow direction of the further cooling air stream, such that the power electronics are situated between the air inlet opening of the further cooling air stream and the flow opening. Intensive, effective cooling of the power electronics is thus ensured.

In an embodiment of the invention, a partial air stream from the surroundings of the housing is supplied to the further cooling air stream via a supplementary air inlet opening formed in the housing. The air inlet opening of the further cooling air stream and the supplementary air inlet opening are situated on different sides of the housing, preferably on sides of the housing which are adjacent to one another across a corner, wherein the printed circuit board of the power electronics, as seen in a plan view of the printed circuit board, lies between the air inlet openings and the internal flow opening to the cooling air fan. It is expediently the case that the air inlet opening of the further cooling air stream opens into the housing interior above a printed circuit board of the power electronics, and the further air inlet opening of the partial air stream opens into the housing interior below the printed circuit board of the power electronics.

The cooling air fan is advantageously arranged directly in front of the air exit opening, such that the cooling air fan does not have to operate counter to a back pressure. Thus, a good conveying action is ensured even in the case of small cooling air fans.

The cooling air streams in the charging unit are expediently conducted in mutually separate housing ducts, such that the cooling air streams are spatially independent of one another up until the point at which they merge on the suction side of the cooling air fan.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
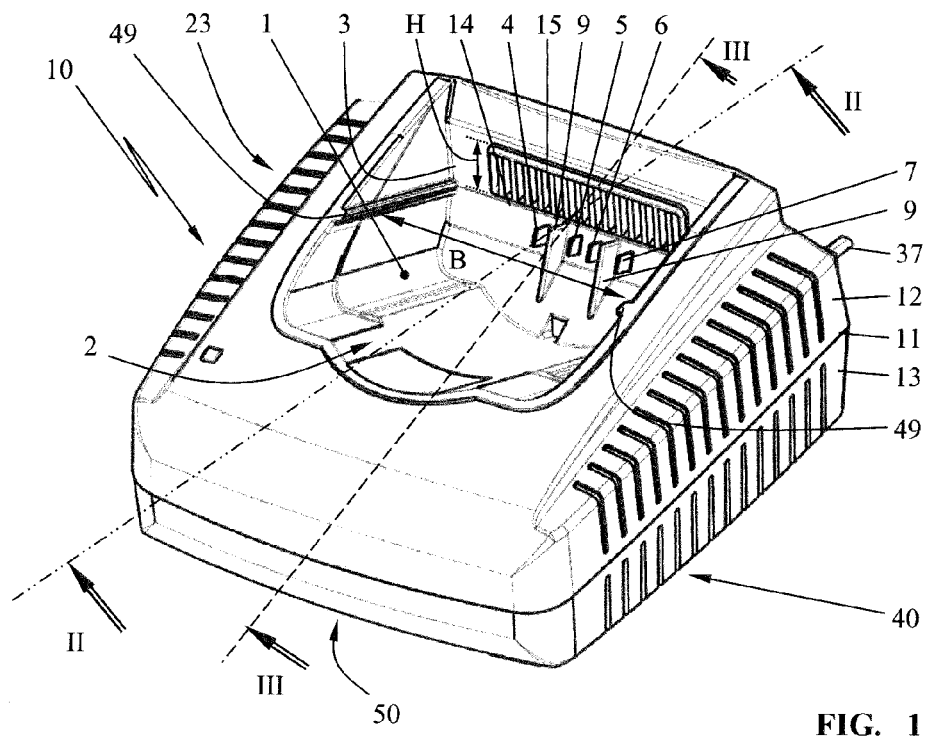
FIG. 1 is a perspective view of a charging unit according to the invention.
Figure 2:
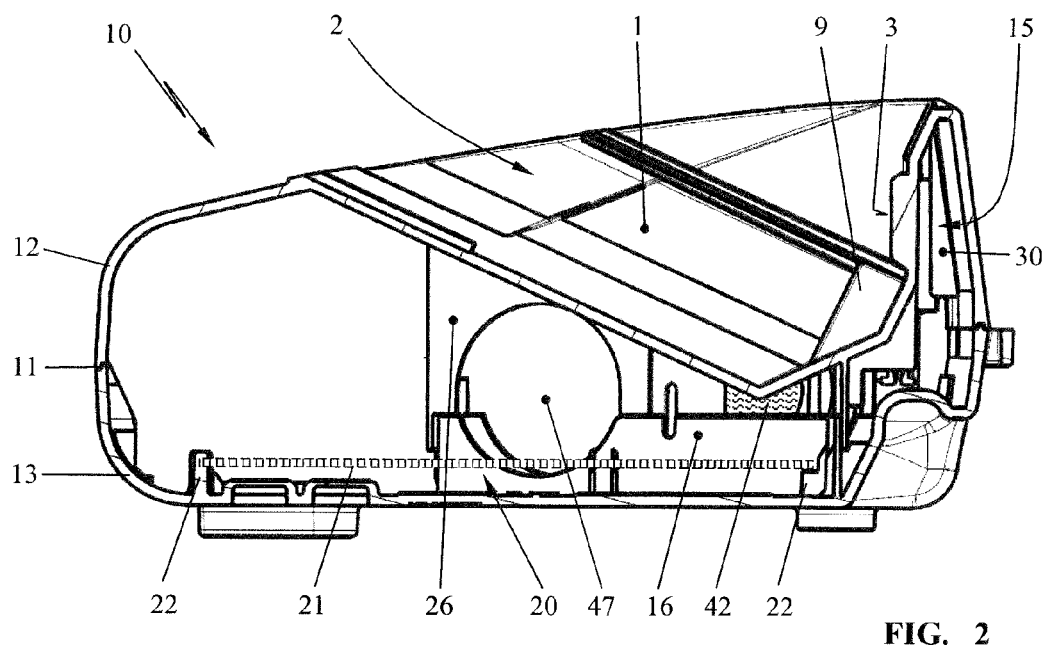
FIG. 2 is a schematic section of the charging unit taken along line II-II in FIG. 1.
Figure 3:
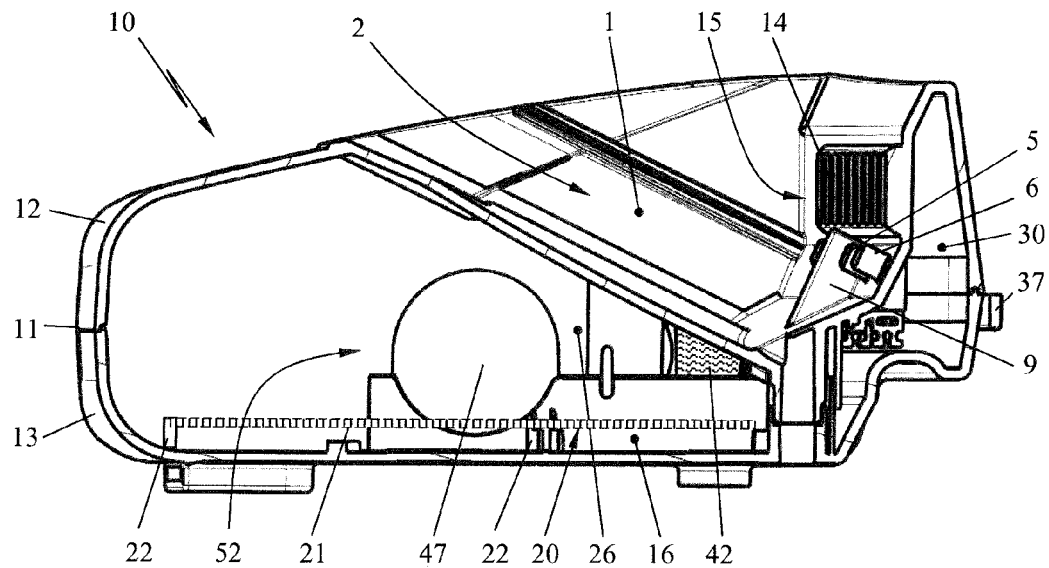
FIG. 3 is a schematic section of the charging unit taken along line in FIG. 1.

The charging device 10 illustrated in FIG. 1 is made of a housing 11 which is assembled from an upper shell 12 and a lower shell 13. The housing 11 of the charging device 10 has a charging receptacle 1. The charging receptacle 1 is—as shown in FIGS. 1 to 4—advantageously formed in the manner of a charging shell 2. Below, the charging device 10 will be described, by way of example, as having a charging receptacle 1 in the form of a charging shell 2; other configurations of the charging receptacle 1 may be practical, for example a charging slot or the like.

Figure 4:
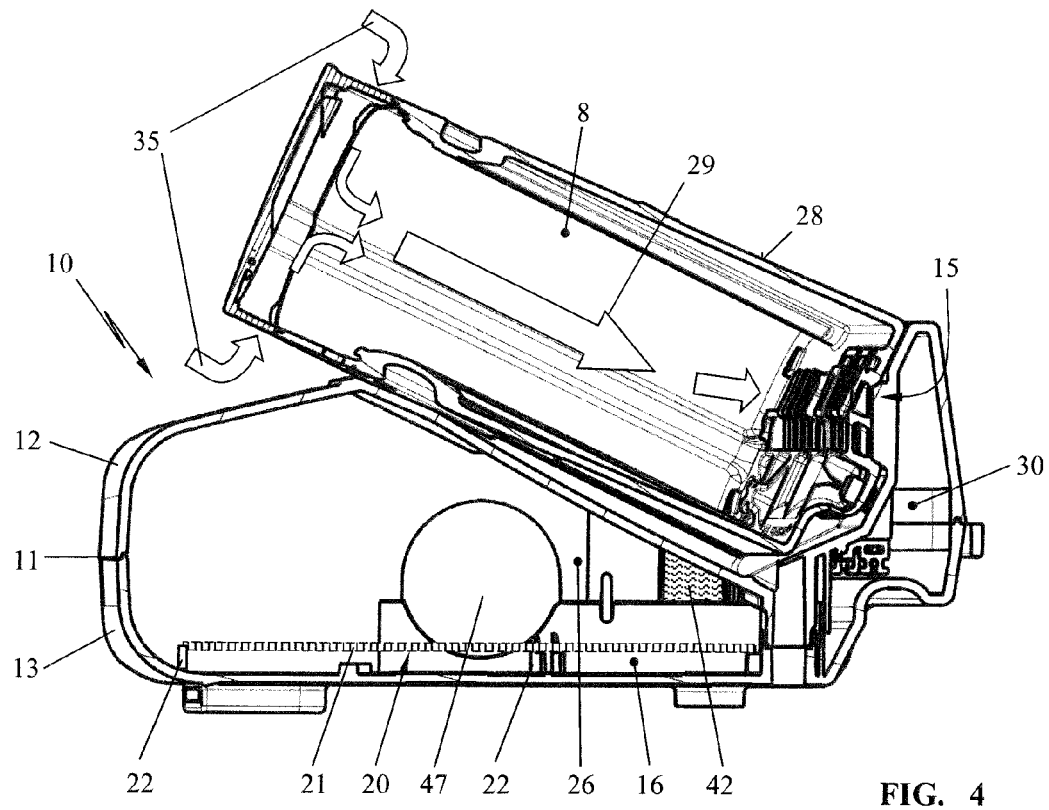
FIG. 4 is a section as per FIG. 3 with a battery pack inserted into a charging receptacle of the charging device.

In the face region 3 of the charging receptacle 1, there are formed electrical connection contacts (4, 5, 6, 7) which interact with corresponding electrical connectors in the housing 28 of a battery pack 8 (FIG. 4). In this case, the outer electrical connection contacts (4, 7) form power contacts by way of which the rechargeable cells of the battery pack 8 are charged. Between the connection contacts (4, 7) there are situated connection contacts (5, 6) in the form of communication contacts. Via the communication contacts (5, 6), a protective circuit arranged in the battery pack 8 communicates with power electronics (FIG. 6) arranged in the charging device 10. To ensure spatial separation between the power-conducting connection contacts (4, 7) (FIG. 1) and the connection contacts (5, 6) which transmit communication data, separating ribs 9 are provided in the charging receptacle 1. The battery pack 8 can be inserted in a correctly oriented manner into the charging receptacle 1 only in one predefined position, which is predefined by the lateral guide ribs 49 in the charging receptacle 1. On the battery pack 8 there are formed guide grooves into which the guide ribs 49 engage. The guide grooves on the battery pack 8 are formed eccentrically, such that the battery pack can be inserted only in one predefined position, in which contacting of the connection contacts 4 to 7 with the correct polarity is ensured.

Also provided in the face region 3 of the charging receptacle 1 is an air inlet opening 15 which, in the embodiment shown, extends over more than half of the width B of the charging receptacle 1. The height H of the air inlet opening 15 corresponds approximately to half of the height of the face region 3, wherein the air inlet opening 15 has an air inlet grille 14.

Power electronics 20 are provided within the preferably substantially closed housing 11 of the charging device 10. The printed circuit board 21 of the power electronics 20 is held on supports 22 in the lower shell 13. The power electronics 20 are electrically connected by way of the connection contacts (4, 5, 6, 7) to a battery pack 8 which is positioned in the charging receptacle 1; the power electrics 20 are connected to a supply voltage via an electrical connector 37.

Figure 5:
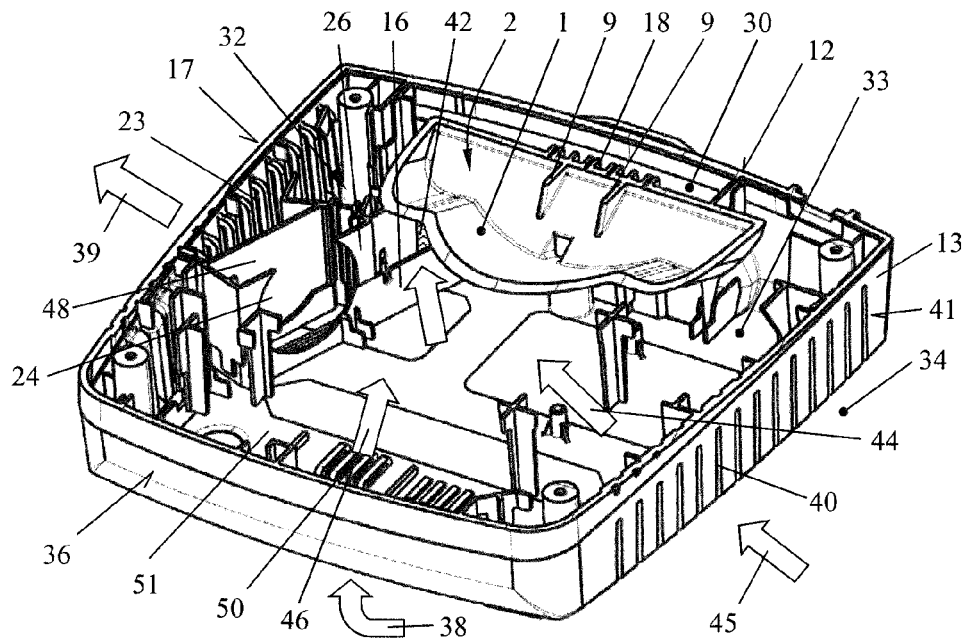
FIG. 5 is a horizontal section through the charging device as per FIG. 1.
Figure 6:
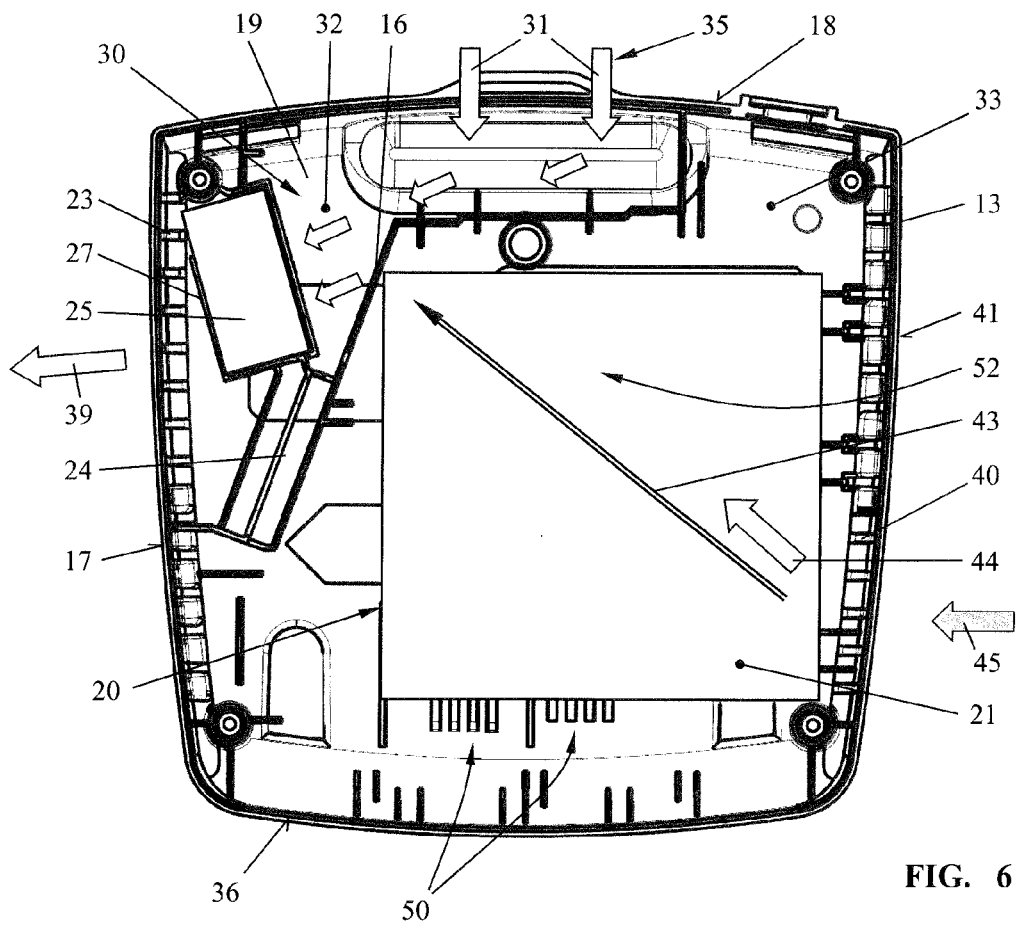
FIG. 6 is a schematic of the lower shell of the charging device as per FIG. 1; and, FIG. 7 is an enlarged view of a housing section of the lower shell as per FIG. 6 for accommodating cooling air fans.
Figure 7:
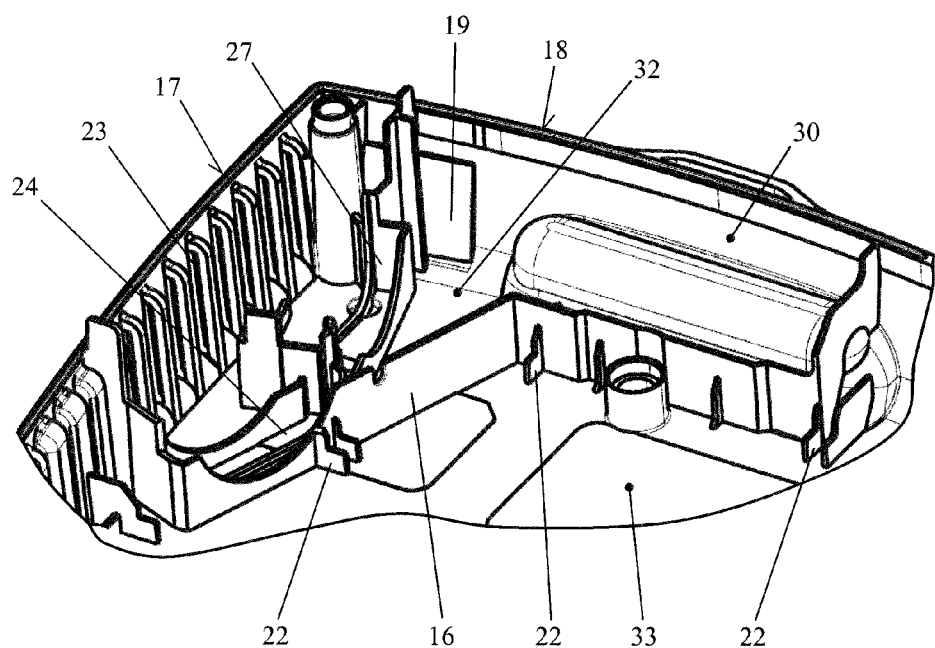

As can be seen from FIGS. 5 and 6, there is formed in the lower shell 13 a partition 16 which runs approximately from the middle of a side wall 17 to a rear wall 18. The partition 16 of the lower shell 13 interacts with a partition 26 (FIG. 2) of the upper shell 12, in such a way that an air-conducting housing duct 30 is formed in the interior of the closed housing 11. The partition 16 and the partition 26—extending across a corner of the housing 11, separate a partial space 19 from the housing interior 33. The interior of the lower shell 13 and of the upper shell 12, that is, the interior of the housing 11, is divided into two sub-regions.

Via the air inlet opening 15 in the face region 3 of the charging receptacle 1, a suction air stream 35 (FIG. 6) flows to the air-conducting housing duct 30 which is formed in the interior of the closed housing 11. The suction air stream 35 is formed by a battery air stream 29 (FIG. 4) which flows through the battery pack 8 and, as a cooling air stream 31, enters the housing duct 30. The cooling air stream 31 conducted through the housing duct 30 is discharged via an air exit opening 23 in the side wall 17 of the lower shell 13.

A cooling air fan 25 is provided for conveying the suction air stream 35, which enters as a battery air stream 29 through the air inlet opening 15 and flows, as a cooling air stream 31, through the housing duct 30 to the air exit opening 23. When a battery pack 8 is inserted into the charging receptacle 1, the air inlet opening 15 of the charging device 10 communicates directly with a cooling air opening in the housing 28 of the battery pack 8, such that the battery air stream 29 flowing through the battery pack 8 enters the housing duct 30 directly via the air inlet opening 15 and, as a cooling air stream 31 of the charging device 10, is blown out of the housing 11 of the charging device 10 via the air exit opening 23.

As shown in FIGS. 2 to 6, there may be formed in the partition 16 of the lower shell 13 an opening 47 which is delimited by the partition 26 of the upper shell 12. The opening 47 is provided as part of a receptacle 24 for a further, optional cooling air fan (not illustrated). The receptacle 24 for the optional cooling air fan and the receptacle 27 for the cooling air fan 25 arranged in the housing duct 30 are situated adjacent to one another. The cooling air fan 25 arranged in the receptacle 27 and an optional cooling air fan that is advantageously arranged in the receptacle 24 jointly blow conveyed cooling air out via the air exit opening 23 in the housing 11. The receptacle 24 for the optional cooling air fan is provided separately from the housing duct 30, such that the suction sides of an optional cooling air fan arranged in the receptacle 24 and of a cooling air fan 25 arranged in the receptacle 27 are spatially separate from one another. The housing duct 30 exclusively conducts the cooling air stream 31 to the cooling air fan 25, whereas the receptacle 24 is connected exclusively to the housing interior 33. In the embodiment shown, the receptacle 24 is closed off in air-tight fashion with respect to the air exit opening 23 by a barrier wall 48 of the upper shell 12 (FIG. 5), such that the housing interior 33 is connected in terms of flow to a suction zone 32 of the cooling air fan 25 in the housing duct 30 exclusively via a window-like flow opening 42. In the embodiment, the flow opening 42 is provided as a window-like internal flow opening 42, and is expediently formed, preferably as a recess, in the partition 26 of the upper shell 12.

According to the invention, there is provided in the housing 11 a further air inlet opening 40 which opens into the housing interior 33. The further air inlet opening 40 is preferably formed in that side wall 41 of the housing 11 which is situated opposite the side walls 17. As shown in FIG. 6, the further air inlet opening 40 and the flow opening 42 are situated approximately diagonally opposite one another. The flow opening 42 is provided in the side wall of the housing duct 30. In the embodiment, the flow opening 42 is situated in the partition 26 of the upper shell 12 of the housing 11. The flow opening 42 preferably opens directly into the suction zone 32 of the cooling air fan 25. The cross-sectional area of the flow opening 42 is smaller than, and is preferably formed so as to be less than half the size of, the air inlet opening 15 via which the suction air stream 35, as a cooling air stream 31, enters the housing duct 30. In the embodiment shown, the cross-sectional area of the flow opening 42 amounts to less than one third of the cross-sectional area of the air inlet opening 15.

Owing to the flow opening 42 in the inner side wall of the housing duct 30, air is drawn in—in particular as an additional partial air stream—from the housing interior 33. A slight negative pressure is generated in the housing interior 33. To compensate for the negative pressure, a suction air stream 45 flows in from the surroundings 34 of the housing via the air inlet opening 40. Thus, a further cooling air stream 44 is generated which enters the housing interior 33 from the surroundings 34 of the housing via the air inlet opening 40. The further cooling air stream 44 flows via the power electronics 20 in the direction of the supplementary flow opening 42 and enters the housing duct 30 through the flow opening 42. The flow opening 42 is situated with a small spacing to the rear wall 18 of the housing 11, whereas the air inlet opening 40 is situated close to the front face wall 36 of the housing. This gives rise to a flow path 43 which—as seen in the plan view as per FIG. 6 onto the printed circuit board 21 of the power electronics 20—runs approximately diagonally through the housing interior 33. Thus, the power electronics 20 are situated in the flow path 43 of the further cooling air stream 44 between the internal flow opening 42 and the outer air inlet opening 40 in the housing 11.

The further cooling air stream 44 entering the housing interior 33 through the air inlet opening 40 merges, after passing through the flow opening 42 and entering the housing duct 30, with the cooling air stream 31 entering via the air inlet opening 15. The suction air streams 35 and 45 and the cooling air streams 31 and 44 are jointly discharged from the housing 11, as a common exit air stream 39, by way of the cooling air fan 25. The cooling air fan 25 is in this case advantageously situated directly upstream of the air exit opening 23.

The spatially mutually separate suction air streams 35 and 45 are supplied as cooling air stream 31 and further cooling air stream 44 to the common cooling air fan 25. In this case, the first cooling air stream 31 is conducted in the first housing duct 30, which is delimited by the partitions 16 and 26. The further cooling air stream 44 is conducted in the housing interior 33, which forms a second housing duct 52 which is separate from the first housing duct 30 in terms of flow.

In a further embodiment of the invention, a partial air stream 38 (FIG. 5), as a supplementary cooling air stream 46, is supplied to the further cooling air stream 44 that enters via the air inlet opening 40. The supplementary cooling air stream 46 merges with the further cooling air stream 44 in the housing interior 33. The merging of the cooling air stream 44 with the supplementary cooling air stream 46 advantageously takes place upstream of the internal flow opening 42, expediently at the latest as the streams pass through the flow opening 42. The supplementary cooling air stream 46 flows into the housing 11 from the surroundings 34 of the housing as a partial air stream 38 via a supplementary air inlet opening 50 formed in the housing 11. The air inlet opening 40 of the further cooling air stream 44 and the supplementary air inlet opening 50 of the supplementary cooling air stream 46 are preferably situated on different sides of the housing. In the embodiment, the air inlet opening 40 and the supplementary air inlet opening 50 are preferably situated on sides of the housing which are adjacent across a corner, for example the side wall 41 and the face wall 36. The printed circuit board 21 of the power electronics 20 is situated, in a plan view of the printed circuit board 21, between the air inlet openings (40, 50) and the internal flow opening 42 to the suction zone 32 of the cooling air fan 25.

In an advantageous embodiment, the air inlet opening 40 of the further cooling air stream 44 is situated above the printed circuit board 21 of the power electronics 20, whereas the supplementary air inlet opening 50 of the supplementary cooling air stream 46 opens into the housing interior 33 below the printed circuit board 21 of the power electronics 20. In the embodiment, the supplementary air inlet opening 50 is formed in the base 51 of the lower shell, expediently adjacent to the front face wall 36.

It is understood that the foregoing description is that of the preferred embodiments of the invention and that various changes and modifications may be made thereto without departing from the spirit and scope of the invention as defined in the appended claims.

What is claimed is:

1. A charging device for a battery pack, the charging device comprising:
   a housing having a charging receptacle formed thereon;
   said charging receptacle having outer connecting contacts configured to form an electrical connection with the battery pack;
   said housing further having an electrical connector configured to connect to a supply voltage;
   power electronics arranged between said electrical connector and said outer connecting contacts;
   said housing defining a first air inlet opening and an air outlet opening;
   a cooling air fan arranged in said housing and configured to generate a cooling air flow entering said housing as a first suction air flow via said first air inlet opening and exiting said housing via said air outlet opening;
   said first air inlet opening communicating with a battery air flow flowing through the battery pack so as to permit said battery air flow to flow to said first air inlet opening as a first cooling air flow;

said housing defining a second air inlet opening configured to permit a further suction air flow to flow into said housing from the surroundings of said housing as a second cooling air flow;

said second cooling air flow being separated from said battery air flow;

said second air inlet opening and said cooling air fan conjointly defining a flow path therebetween;

said power electronics being disposed in said flow path; and, said second cooling air flow being guided along said flow path to said cooling air fan after cooling said power electronics.

2. The charging device of claim 1, wherein said first cooling air flow and said second cooling air flow are guided to said cooling air fan as spatially separate cooling air flows with said cooling air fan being common to both said first and second cooling air flows.

3. The charging device of claim 2, wherein said cooling air fan is configured to join said first cooling air flow and said second cooling air flow into a common exiting air flow.

4. The charging device of claim 1, wherein:
said cooling air fan defines a suction zone; and,
said housing defines an inner flow opening configured to permit said second cooling air flow to open into said suction zone.

5. The charging device of claim 4, wherein:
said housing defines a housing interior; and,
said inner flow opening is disposed in said flow path of said second cooling air flow downstream of said power electronics in said housing interior.

6. The charging device of claim 4, wherein:
said housing has a supplementary air inlet opening formed therein; and,
said supplementary air inlet opening is configured so as to enable a partial air flow from the ambient of said housing to flow into said second cooling air flow.

7. The charging device of claim 4, wherein:
said housing defines a housing interior;
said power electronics include a circuit board; and,
said second air inlet opening for said second cooling air flow opens into said housing interior above said circuit board.

8. The charging device of claim 4, wherein:
said power electronics include a circuit board;
said housing defines a housing interior and has a supplementary air inlet opening configured so as to enable a partial air flow from the ambient of said housing to flow into said housing interior below said circuit board.

9. The charging device of claim 1, wherein said cooling air fan is arranged directly ahead of said air outlet opening.

10. The charging device of claim 1, wherein:
said housing has a first channel and a second channel formed therein so as to be mutually separated for conducting corresponding ones of said first cooling air flow and said second cooling air flow therein.

* * * * *

UNITED STATES PATENT AND TRADEMARK OFFICE
CERTIFICATE OF CORRECTION

PATENT NO. : 9,762,073 B2  
APPLICATION NO. : 14/841316  
DATED : September 12, 2017  
INVENTOR(S) : Friedhelm Koch et al.

Page 1 of 1

It is certified that error appears in the above-identified patent and that said Letters Patent is hereby corrected as shown below:

In the Specification

In Column 3:
Line 19: insert --III-III-- after "line".

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*